(12) United States Patent
Mitsuhashi

(10) Patent No.: US 9,324,648 B2
(45) Date of Patent: Apr. 26, 2016

(54) SEMICONDUCTOR DEVICE, METHOD FOR MANUFACTURING SAME, AND ELECTRONIC COMPONENT

(71) Applicant: ROHM CO., LTD., Kyoto (JP)

(72) Inventor: Toshiro Mitsuhashi, Tokyo (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/356,481

(22) PCT Filed: Nov. 14, 2012

(86) PCT No.: PCT/JP2012/079508
§ 371 (c)(1),
(2) Date: May 6, 2014

(87) PCT Pub. No.: WO2013/073573
PCT Pub. Date: May 23, 2013

(65) Prior Publication Data
US 2014/0291841 A1    Oct. 2, 2014

(30) Foreign Application Priority Data

Nov. 15, 2011  (JP) ................................. 2011-249938

(51) Int. Cl.
*H01L 23/498*   (2006.01)
*H01L 21/768*   (2006.01)
*H01L 23/14*    (2006.01)
(Continued)

(52) U.S. Cl.
CPC .... *H01L 23/49827* (2013.01); *H01L 21/76877* (2013.01); *H01L 21/76898* (2013.01); *H01L 23/147* (2013.01); *H01L 23/49811* (2013.01); *H01L 23/5226* (2013.01); *H01L 23/3114* (2013.01); *H01L 23/49816* (2013.01); *H01L 25/0657* (2013.01); *H01L 25/18* (2013.01); *H01L 2224/0401* (2013.01); *H01L 2224/05009* (2013.01); *H01L 2224/06181* (2013.01); *H01L 2224/16145* (2013.01); *H01L 2224/16225* (2013.01); *H01L 2225/06513* (2013.01); *H01L 2225/06517* (2013.01);
(Continued)

(58) Field of Classification Search
CPC .................. H01L 21/76877; H01L 23/49827; H01L 23/49811
USPC .......................................... 257/737; 438/667
See application file for complete search history.

(56) References Cited

U.S. PATENT DOCUMENTS

2004/0043615 A1    3/2004  Yamamoto et al.
2009/0130846 A1*   5/2009  Mistuhashi ................... 438/667
(Continued)

FOREIGN PATENT DOCUMENTS

JP    2000-031144 A    1/2000
JP    2004-095849 A    3/2004
(Continued)

*Primary Examiner* — Christine Enad
(74) *Attorney, Agent, or Firm* — Rabin & Berdo, P.C.

(57) ABSTRACT

A plurality of insulating film rings are selectively formed on a front surface of an Si substrate, and surface pads are formed opposite openings of the insulating film rings. Next, by etching the Si substrate from a back surface, through holes that pass through the openings of the insulating film rings and reach the surface pads are formed. Through electrodes that connect electrically with the surface pads are formed by forming a via insulating film (35) on the sides of the through holes and then filling the through holes with electrode material.

25 Claims, 11 Drawing Sheets

(51) Int. Cl.
  *H01L 23/522* (2006.01)
  *H01L 25/18* (2006.01)
  *H01L 23/31* (2006.01)
  *H01L 25/065* (2006.01)

(52) U.S. Cl.
  CPC .............. *H01L 2225/06541* (2013.01); *H01L 2225/06572* (2013.01); *H01L 2924/15311* (2013.01)

(56) References Cited

U.S. PATENT DOCUMENTS

| | | |
|---|---|---|
| 2009/0302430 A1 | 12/2009 | Takahashi et al. |
| 2010/0327383 A1* | 12/2010 | Hayasaki .......... H01L 21/76898 257/432 |
| 2011/0024849 A1 | 2/2011 | Akiyama |
| 2011/0084400 A1* | 4/2011 | Fujii ............................ 257/774 |
| 2011/0089571 A1 | 4/2011 | Matsuo |
| 2012/0007154 A1* | 1/2012 | Lin et al. ....................... 257/288 |
| 2012/0086120 A1* | 4/2012 | Chen et al. .................... 257/737 |
| 2012/0248602 A1 | 10/2012 | Takahashi et al. |
| 2013/0015504 A1* | 1/2013 | Kuo ........................ H01L 21/84 257/213 |
| 2013/0020722 A1 | 1/2013 | Matsuo |
| 2013/0328188 A1 | 12/2013 | Fujii |

FOREIGN PATENT DOCUMENTS

| | | |
|---|---|---|
| JP | 2009-124087 A | 6/2009 |
| JP | 2009-295851 A | 12/2009 |
| JP | 2009-295859 A | 12/2009 |
| JP | 2011-029491 A | 2/2011 |
| JP | 2011-086773 A | 4/2011 |
| JP | 2011-086850 A | 4/2011 |
| JP | 2011-100963 A | 5/2011 |

* cited by examiner

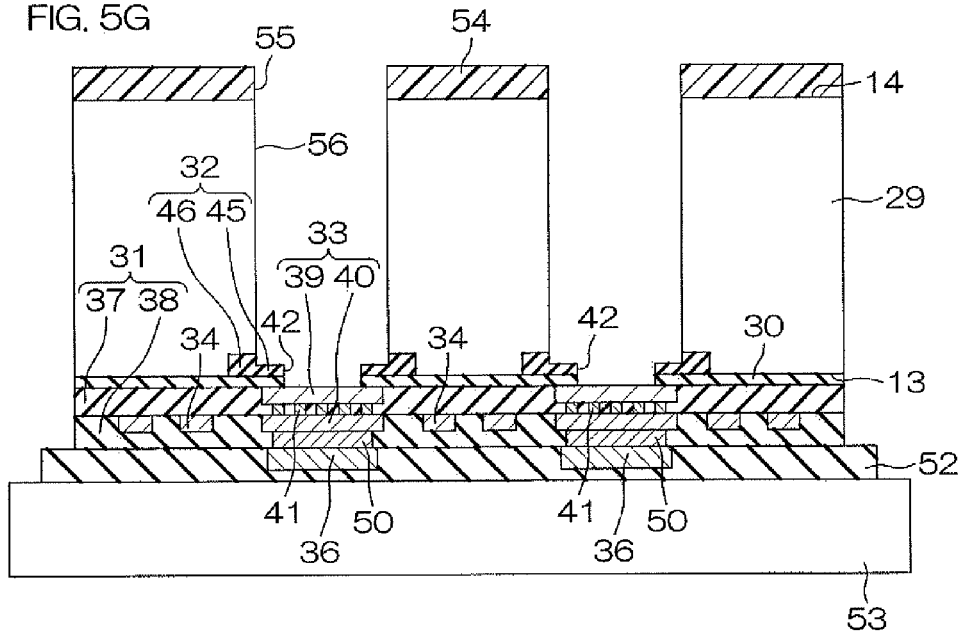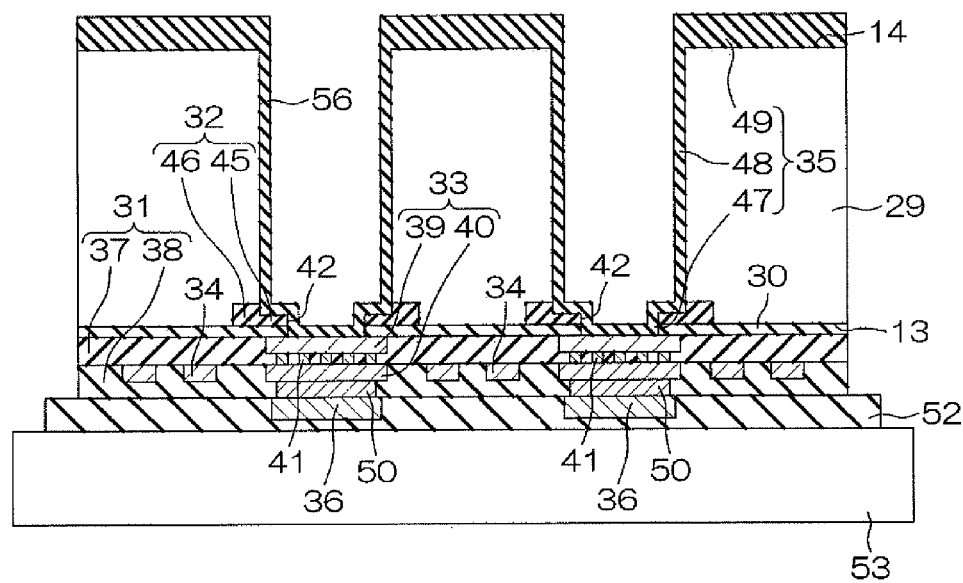

SEMICONDUCTOR DEVICE, METHOD FOR MANUFACTURING SAME, AND ELECTRONIC COMPONENT

TECHNICAL FIELD

The present invention relates to a semiconductor device having through electrodes, a method for manufacturing the semiconductor device, and an electronic component (package) provided with the semiconductor device.

BACKGROUND ART

In recent years, a technique has been developed for producing an electronic component, which is small in size, which is large in capacity, and which is high in performance, by stacking together a plurality of semiconductor devices each of which has through electrodes.

A semiconductor device having through electrodes is disclosed by, for example, Patent Literatures 1 and 2.

Each of the semiconductor devices of Patent Literatures 1 and 2 includes an Si substrate, through electrodes provided in the Si substrate, electrode pads formed on a surface of the Si substrate, and a rearrangement wiring layer formed on the electrode pads.

This semiconductor device is manufactured according to, for example, the following method. First, an electrode pad is formed on the surface of the Si substrate with an insulating film therebetween, and a rearrangement wiring layer is formed. Thereafter, dry etching is performed from the reverse surface of the Si substrate to a halfway point of the Si substrate by use of a first etching gas ($SF_6$). Subsequently, a remaining part of the Si substrate is subjected to dry etching by use of a second etching gas ($C_4F_8$), and, as a result, a through hole that reaches the electrode pad is formed. Thereafter, an insulating film is formed on the side surface of the through hole, and a through electrode is formed inside the insulating film. A semiconductor device having through electrodes can be obtained through these steps.

CITATION LIST

Patent Literature

PTL 1: Japanese Patent Application Publication No. 2011-86773
PTL 2: Japanese Patent Application Publication No. 2011-86850

SUMMARY OF INVENTION

Technical Problem

An object of the present invention is to provide a semiconductor device both capable of greatly reducing the size of a through electrode and capable of reducing the size of a surface electrode.

Another object of the present invention is to provide a method for manufacturing a semiconductor device capable of reliably bringing a through electrode into contact with a surface electrode regardless of the size of the surface electrode.

Still another object of the present invention is to provide an electronic component capable of achieving a reduction in size, an increase in capacity, and an improvement in performance by providing through electrodes in a semiconductor device in a high density.

Solution to Problem

A semiconductor device of the present invention includes a semiconductor substrate, a plurality of insulating film rings selectively formed on a surface of the semiconductor substrate, a through electrode penetrating through the semiconductor substrate, the through electrode passing through an opening of the insulating film ring, a via insulating film disposed between the through electrode and the semiconductor substrate, and a surface electrode facing the opening apart on a side of the surface with respect to the insulating film ring electrically connected to the through electrode (claim 1).

This semiconductor device can be manufactured according to a method for manufacturing a semiconductor device that includes a step of selectively forming a plurality of insulating film rings on a surface of a semiconductor substrate, a step of forming a surface electrode so as to face the opening on an opposite side of the semiconductor substrate with respect to the insulating film ring, a step of forming a through hole that passes through the opening of the insulating film ring and then reaches the surface electrode by etching the semiconductor substrate from a reverse surface, a step of forming a via insulating film on a side surface of the through hole, and a step of forming a through electrode so as to be electrically connected to the surface electrode by filling the through hole having the via insulating film with an electrode material (claim 14).

According to this method, the insulating film ring that has the opening at the surface of the semiconductor substrate is beforehand formed so as to face the position at which the surface electrode is formed in the upper part of the semiconductor substrate. Therefore, at the step in which the semiconductor substrate is etched from the reverse surface toward the surface electrode after forming the surface electrode on the insulating film ring, the etching can be guided to the opening by use of a difference in the etching rate between the insulating film ring and the semiconductor substrate (by using the insulating film ring as a mask) after the etching reaches the insulating film ring even if a gap is generated between an ideal etching position (position of the opening of the insulating film ring) and an actual etching position.

Therefore, the bottom portion of the through hole formed by this etching can be fixed to the position of the opening of the insulating film ring. In other words, the through hole can be allowed to reach the surface electrode disposed at the upper part of the semiconductor substrate so as to face the opening of the insulating film ring of the surface of the semiconductor substrate in a self-aligned manner. As a result, the through electrode can be reliably brought into contact with the surface electrode by filling the through hole with an electrode material.

Therefore, according to the present invention, the through hole that reaches the surface electrode can be accurately formed regardless of the size of the surface electrode unlike a conventional example in which the surface electrode has been always designed to be greater than the diameter of the through hole in consideration of the matching accuracy of patterning performed when the through hole is formed. Therefore the degree of freedom of the size of the surface electrode can be widened.

This makes it possible to make the surface electrode smaller in size than a conventional one when the through electrode is greatly reduced in size in the semiconductor device of the present invention. As a result, the through electrodes can be disposed in a high density, and therefore it is possible to achieve a semiconductor device that is small in size, that is large in capacity, and that is high in performance.

Additionally, a space between mutually adjoining surface electrodes can be widened by reducing the surface electrode in size, and therefore its space can be effectively used. For example, wiring lines or the like can be laid in that space.

Preferably, in the semiconductor device of the present invention, the through electrode includes a bottom portion inside the opening and a main portion outside the opening, and the main portion projects in a lateral direction with respect to the opening so as to lie on an inner edge portion of the insulating film ring that defines the opening (claim 2).

According to this arrangement, even when a force is applied to the end on the reverse surface side of the through electrode (main portion), the insulating film ring lying on the main portion acts as a buffering material, and therefore a force transmitted to the surface electrode can be reduced. As a result, the surface electrode can be prevented from being damaged, for example, when the semiconductor device is mounted.

The semiconductor device that has this arrangement can be manufactured, for example, by executing the step of forming the through hole that includes a step of etching the semiconductor substrate by use of a pattern diameter greater than a diameter of the opening so that an inner edge portion in the insulating film ring for defining the opening is exposed in the through hole in the method for manufacturing a semiconductor device (claim 15).

Additionally, the degree of freedom of the size of the surface electrode can be widened in the semiconductor device of the present invention, and therefore the main portion of the through electrode may have a diameter equal to or greater than a diameter of the surface electrode (claim 3). In other words, the surface electrode may have a diameter equal to or smaller than a diameter of the main portion of the through electrode.

The semiconductor device that has this arrangement can be manufactured, for example, by executing the step of forming the through hole that includes a step of etching the semiconductor substrate by use of a pattern diameter equal to or greater than a diameter of the surface electrode in the method for manufacturing a semiconductor device (claim 16).

Additionally, in the semiconductor device of the present invention, the inner edge portion of the insulating film ring is formed to be thinner than an outer edge portion that defines an external shape of the insulating film ring (claim 4).

Preferably, in the semiconductor device of the present invention, the insulating film ring is embedded on a side of the reverse surface with respect to the surface of the semiconductor substrate (claim 5).

According to this arrangement, the end on the surface side of the through electrode is moved back toward the reverse surface by the thickness of the insulating film ring, and therefore it is possible to make the aspect ratio of the through electrode (height of the through electrode/diameter of the through electrode) smaller. Therefore, the step coverage fulfilled when the through hole is filled with an electrode material can be improved. Additionally, a level difference can be eliminated between the surface of the semiconductor substrate and the upper surface of the insulating film ring, and therefore the flatness of the surface of the semiconductor substrate can also be maintained.

The semiconductor device that has this arrangement can be manufactured, for example, by executing the step of forming the insulating film ring that includes a step of forming a shallow trench by etching the semiconductor substrate from the surface and a step of embedding the insulating film ring on a side of the reverse surface with respect to the surface of the semiconductor substrate by filling the shallow trench with an insulation material in the method for manufacturing a semiconductor device (claim 17).

According to this method, when a plurality of element isolation regions are formed in the semiconductor substrate according to, for example, an STI (Shallow Trench Isolation) process, the insulating film ring can be formed at the same step as the STI process, and therefore the insulating film ring can be efficiently formed.

Additionally, the semiconductor device of the present invention may include a wiring line laid between the surface electrodes that adjoin each other (claim 6).

Additionally, the surface electrode may include a multilayer electrode whose layers are stacked with an interlayer insulating film therebetween (claim 7).

Additionally, the semiconductor device of the present invention may include a surface bump for external connection and the surface bump is disposed directly above the through electrode so that the surface electrode is placed between the through electrode and the surface bump (claim 8), and the semiconductor device may include a reverse bump for external connection and the reverse bump is disposed at an end on aside of the reverse surface of the through electrode (claim 9).

Additionally, the insulating film ring may be formed in an annular shape (claim 10). Additionally, the through electrode may be formed in a cylindrical shape (claim 11).

Additionally, the surface of the semiconductor substrate may include an element-forming surface on which a plurality of semiconductor elements are formed (claim 12).

Additionally, an electronic component of the present invention includes an interposer having a plurality of outside terminals at a reverse surface thereof, the semiconductor device according to anyone of claim 1 to claim 12 stacked on a surface of the interposer in a posture in which a surface of the semiconductor device is directed upwardly, a second semiconductor device that has a plurality of reverse bumps and that is stacked on the surface of the semiconductor device so that the reverse bump is electrically connected to the through electrode, and a resin package sealing the semiconductor device and the second semiconductor device (claim 13).

According to this arrangement, the semiconductor device of the present invention is mounted thereon, and therefore a reduction in size, an increase in capacity, and an improvement in performance can be achieved by providing the through electrodes at the semiconductor device in a high density.

BRIEF DESCRIPTION OF DRAWINGS

FIG. 5G is a view showing a step subsequent to the step of FIG. 5F.

FIG. 5H is a view showing a step subsequent to the step of FIG. 5G.

DESCRIPTION OF EMBODIMENTS

Embodiments of the present invention will be hereinafter described in detail with reference to the accompanying drawings.

Figure 1:
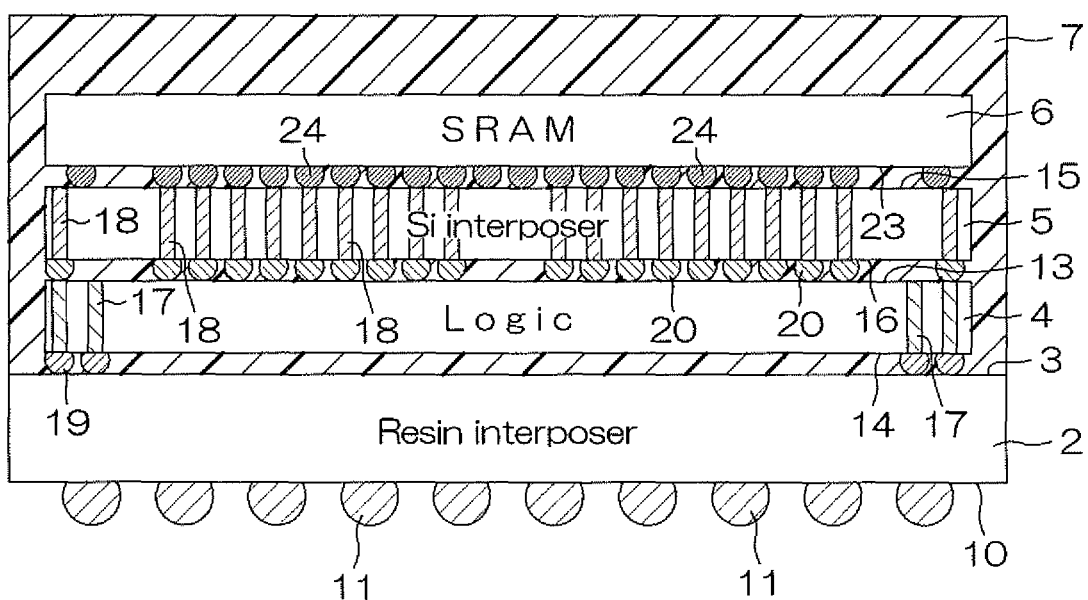
FIG. 1 is a schematic sectional view of an electronic component according to an embodiment of the present invention.
Figure 2:
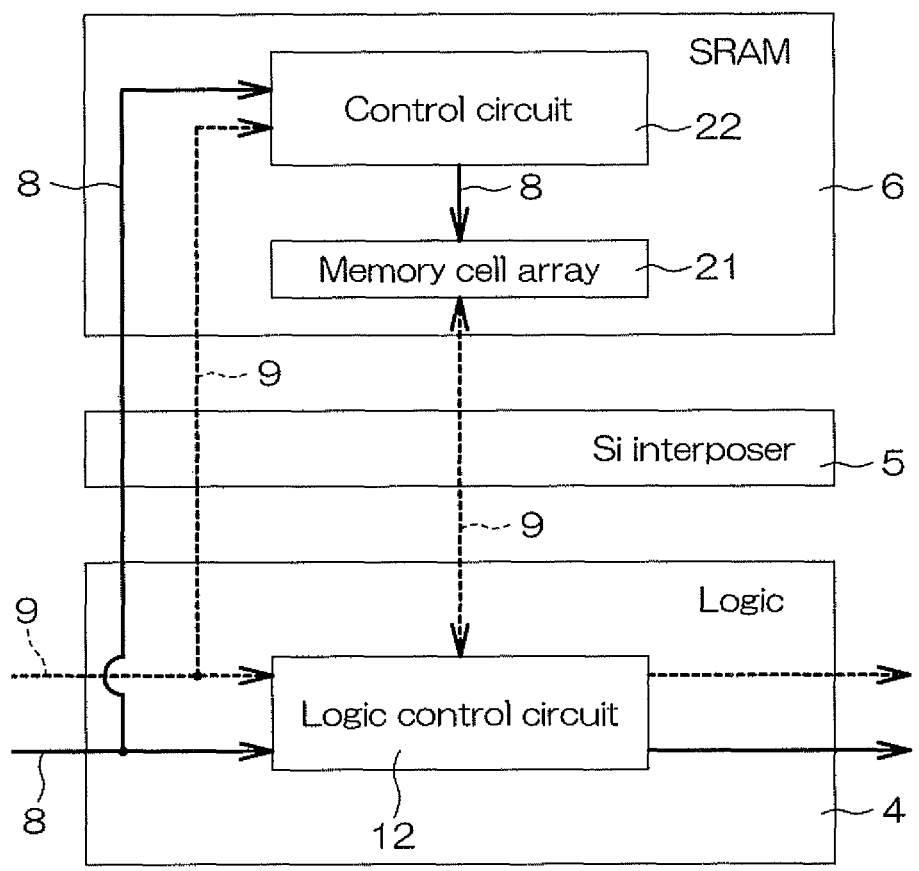
FIG. 2 is a block diagram that schematically shows a system configuration of the electronic component of FIG. 1.

FIG. 1 is a schematic sectional view of an electronic component 1 according to an embodiment of the present invention. FIG. 2 is a block diagram that schematically shows a system configuration of the electronic component 1 of FIG. 1.

The electronic component 1 includes a resin interposer 2, an arithmetic chip 4, an Si interposer 5, and a memory chip 6 that are stacked together in order from a surface 3 of the resin interposer 2, and a resin package 7, and has power-supply wiring lines 8 and signal-system wiring lines 9 built therein. It should be noted that the arithmetic chip 4, the Si interposer 5, and the memory chip 6 are one example of a plurality of semiconductor devices stacked together on the surface 3 of the resin interposer 2, and the present invention is not limited to this.

The resin interposer 2 is made of a resin (e.g., epoxy resin) substrate, and the arithmetic chip 4 etc., are stacked together on the surface 3 thereof, whereas a plurality of outside terminals 11 are formed on a reverse surface 10 thereof. The resin interposer 2 is 14 mm square in size, and may be, for example, from 10 mm square to 15 mm square. The resin interposer 2 is 0.7 mm in thickness, and may be, for example, from 0.6 mm to 0.7 mm in thickness.

The outside terminal 11 is a terminal for an electric connection with lands (electrodes) on a mounting substrate (printed-circuit board). Each outside terminal 11 is shaped like a ball by use of a metallic material, such as solder, and is arranged, for example, in a matrix manner with an interval between each other. Each outside terminal 11 is electrically connected to a reverse bump 19 (described later) of the arithmetic chip 4 through an electrically-conductive via (not shown) that penetrates between the surface 3 and the reverse surface 10 of the resin interposer 2.

In the present embodiment, the arithmetic chip 4, the Si interposer 5, and the memory chip 6 are formed to be equal in size to each other, and are properly stacked together so that their side surfaces are aligned with each other. These chips are 10 mm square in size, and may be, for example, from 6 mm square to 10 mm square. These chips are smaller than the resin interposer 2, and are 0.05 mm in thickness, and may be, for example, from 0.04 mm to 0.06 mm in thickness.

As shown in FIG. 2, a logic control circuit 12 is built into the arithmetic chip 4 serving as a semiconductor device disposed between the resin interposer 2 and the uppermost memory chip 6 serving as a second semiconductor device among those semiconductor chips 4 to 6. The power-supply wiring line 8 and the signal-system wiring line 9 of the electronic component 1 are connected to the logic control circuit 12. The arithmetic chip 4 has its surface 13 on which a plurality of semiconductor elements composing the logic control circuit 12, such as a transistor (e.g., CMOS transistor), a diode, a resistor, and a capacitor, are formed. In other words, in the arithmetic chip 4, the surface 13 facing the memory chip 6 is an element-forming surface, and the arithmetic chip 4 is stacked on the resin interposer 2 in a posture in which the element-forming surface 13 is directed upwardly.

Additionally, the arithmetic chip 4 and the Si interposer 5 serving as a semiconductor device have a plurality of through electrodes 17 and 18 formed so as to penetrate between the surfaces 13, 15 and the reverse surfaces 14, 16, respectively, and reverse bumps 19 and 20 are disposed at ends on their reverse surface sides (14 and 16) of the through electrodes 17 and 18, respectively, one by one. Each of the reverse bumps 19 and 20 is shaped like a ball by use of a metallic material such as solder. The reverse bump 19 of the arithmetic chip 4 is electrically connected to the semiconductor element on the surface 13.

On the other hand, a memory cell array 21 (in the present embodiment, SRAM (Static Random Access Memory) cell array) and a control circuit 22 are built into the uppermost memory chip 6, and the power-supply wiring line 8 and the signal-system wiring line 9 of the electronic component 1 are connected to these circuits 21 and 22. More specifically, the control circuit 22 is connected to the memory cell array 21 by means of the power-supply wiring line 8, and the memory cell array 21 is connected to the logic control circuit 12 of the arithmetic chip 4 by means of the signal-system wiring line 9. The memory chip 6 has its reverse surface 23 on which a plurality of semiconductor elements, such as transistors, diodes, resistors, and capacitors, that compose the memory cell array 21 and the control circuit 22 are formed. In other words, in the memory chip 6, the reverse surface 23 facing the arithmetic chip 4 is an element-forming surface, and the memory chip 6 is stacked on the resin interposer 2 in a posture in which the element-forming surface 23 is directed downwardly. Additionally, in the memory chip 6, a plurality of reverse bumps 24 are disposed on the reverse surface 23. Each reverse bump 24 is shaped like a ball by use of a metallic material such as solder. The reverse bump 24 is electrically connected to the semiconductor element on the reverse surface 23.

The reverse bumps 24 of the memory chip 6 are relayed by the through electrodes 18 of the Si interposer 5 and by the reverse bumps 20, and are electrically connected to the through electrodes 17 of the arithmetic chip 4 and to the reverse bumps 19, which differ in pitch. As a result, the semiconductor chips stacked together are electrically connected together, and are electrically connected to the outside terminals 11 of the resin interposer 2.

In the present embodiment, although the arithmetic chip 4 and the memory chip 6 differ in terminal pitch from each other, and therefore the Si interposer 5 serving as an electric relay is interposed between these chips, the Si interposer 5 may be excluded if these chips are exactly equal in terminal pitch to each other.

The resin package 7 (e.g., epoxy resin) seals only the surface side (3) of the resin interposer 2 so as to expose the reverse surface 10 of the resin interposer 2, and covers the whole of the arithmetic chip 4, the Si interposer 5, and the memory chip 6 so as not to expose these chips. Additionally, the resin package 7 is formed such that its side surface becomes flush with the side surface of the resin interposer 2.

Figure 3:
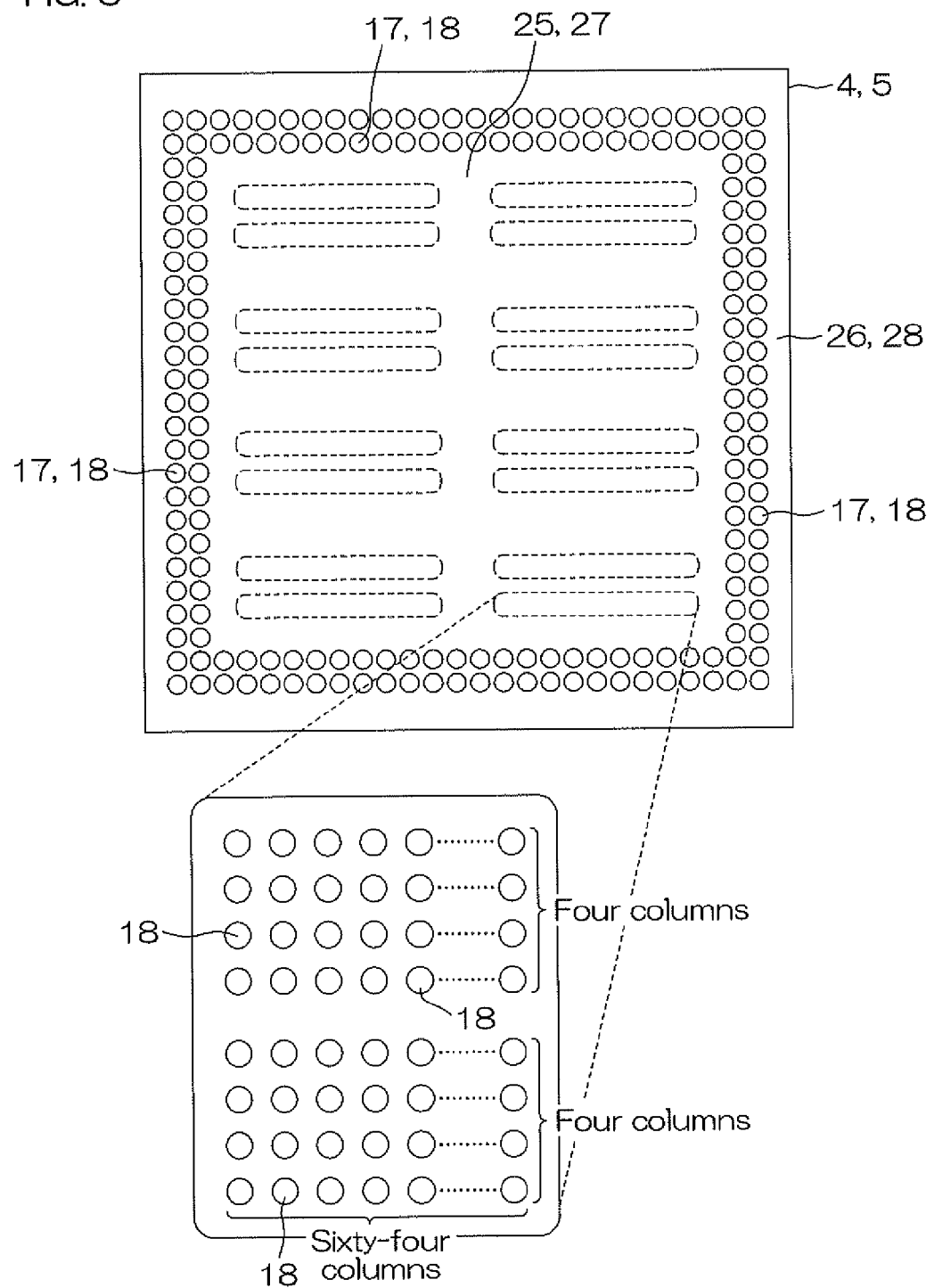
FIG. 3 is a layout chart of through electrodes in an Si interposer and in an arithmetic chip of FIG. 1.

FIG. 3 is a layout chart of the through electrodes 17 and 18 in the Si interposer 5 and the arithmetic chip 4 of FIG. 1.

In the present embodiment, the arithmetic chip 4 and the Si interposer 5 among the semiconductor chips 4 to 6 stacked together have the through electrodes 17 and 18, respectively, as shown in FIG. 1.

In the arithmetic chip 4, for example, the through electrodes 17 arranged in a plurality of columns (in the present embodiment, in two columns) are annularly disposed along a peripheral edge 26 that surrounds a central part 25 of the arithmetic chip 4. For example, the through electrodes 17 of the arithmetic chip 4 may be arranged irregularly and at random, and may be annularly disposed along the peripheral edge 26 of the arithmetic chip 4 as a whole.

This makes it possible for the arithmetic chip 4 to send electric power and electric signals to the memory chip 6 by using the through electrodes 17. In other words, the through electrodes 17 of the arithmetic chip 4 form the power-supply wiring line 8 and the signal-system wiring line 9 of the electronic component 1, and electric power and signals are sent by these wiring lines 8 and 9.

On the other hand, in the Si interposer 5, for example, a single column of through electrodes 18 are annularly disposed along a peripheral edge 28 surrounding a central part 27 of the Si interposer 5 (hereinafter, these through electrodes 18 are referred to as through electrodes 18 of the peripheral edge 28 when necessary), and a plurality of groups each of which consists of a plurality of through electrodes 18 are disposed at the central part 27 surrounded by the peripheral edge 28 in a matrix manner (hereinafter, these through electrodes 18 are referred to as through electrodes 18 of the central part 27 when necessary).

In the present embodiment, each through electrode 18 of the peripheral edge 28 is disposed directly above each through electrode 17 of the arithmetic chip 4 so as to be placed on the same straight line as each through electrode 17 of the arithmetic chip 4.

In each group of the through electrodes 18 of the central part 27, a plurality of blocks each of which consists of a plurality of through electrodes 18 arranged in a matrix manner are provided. More specifically, in the present embodiment, eight groups are arranged in a two-row-and-four-column (2×4) matrix manner, and, in each group, two blocks each of which consists of four-row-and-sixty-four-column (4×64) through electrodes 18 are provided, i.e., five hundred and twelve through electrodes 18 in total are provided for one group. These groups are eight in number, and therefore 4096 (512 pieces×8 groups) through electrodes 18 are provided in the whole of the Si interposer 5.

As a result, the Si interposer 5 can relay an electric signal having a number of bits (in the present embodiment, 4096 bits) corresponding to the number of the through electrodes 18 of the central part 27 between the arithmetic chip 4 (e.g., the logic control circuit 12) and the memory chip 6 (e.g., the memory cell array 21), for example, by using the through electrodes 18 of the central part 27. In other words, the through electrodes 18 of the central part 27 of the Si interposer 5 form the signal-system wiring line 9 of the electronic component 1, and an electric signal is bidirectionally transmitted and received by this wiring line 9. The arrangement or the number of the through electrodes 18 is merely one example of the present invention, and this can be appropriately changed according to the design of each electronic component 1. For example, 256 through electrodes 18 of one block may be arranged in an eight-row-and-thirty-two-column (8×32) matrix manner.

Additionally, the Si interposer 5 can relay electric power and an electric signal sent from the arithmetic chip 4 to the memory chip 6 (e.g., the control circuit 22), for example, by using the through electrodes 18 of the peripheral edge 28. In other words, the through electrodes 18 of the peripheral edge 28 of the Si interposer 5 form the power-supply wiring line 8 and the signal-system wiring line 9 of the electronic component 1, and electric power and an electric signal are sent by these wiring lines 8 and 9.

Figure 4:
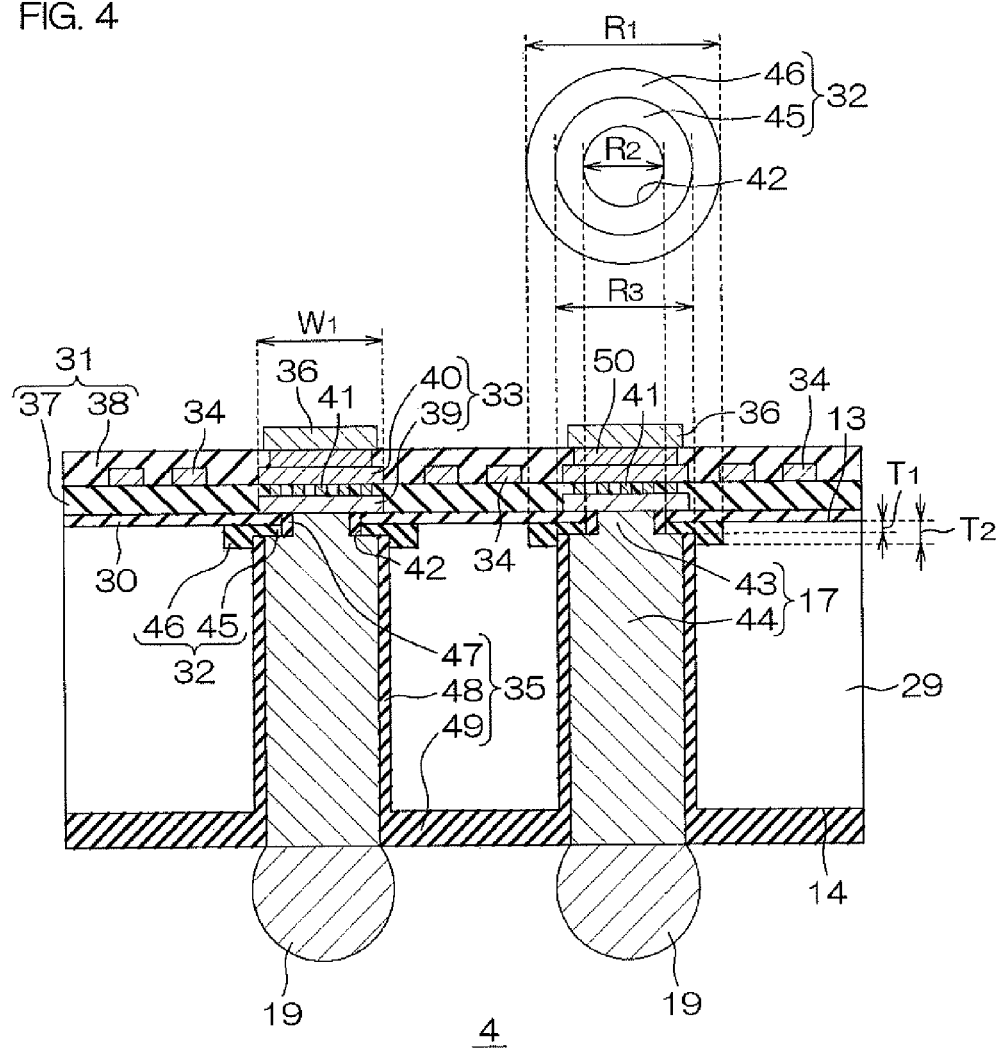
FIG. 4 is a schematic cross-sectional view to describe a structure of the arithmetic chip of FIG. 1, enlarging a part at which a through electrode is disposed.

FIG. 4 is a schematic sectional view to describe a structure of the arithmetic chip 4 of FIG. 1, enlarging a part at which a through electrode 17 is disposed.

The arithmetic chip 4 includes an Si substrate 29 serving as a semiconductor substrate that is a main body of the arithmetic chip 4, a gate insulating film 30, an interlayer insulating film 31, an insulating film ring 32, a surface pad 33 serving as a surface electrode, a pad-to-pad wiring line 34, the through electrode 17, a via insulating film 35, a surface bump 36, and the reverse bump 19.

The Si substrate 29 is a substrate whose thickness is, for example, 30 μm to 50 μm, and has a surface (element-forming surface) 13 on which the gate insulating film 30 and a plurality of (in the present embodiment, two) interlayer insulating films 31 are stacked together in this order. The gate insulating film 30 is a film formed integrally with the gate insulating film 30 of a transistor (not shown) formed on the surface 13, and is shared with this transistor.

A plurality of insulating film rings 32 are selectively embedded in the surface 13 of the Si substrate 29 on the side of the reverse surface 14 with respect to the surface 13, and apart of the surface 13 is formed of the upper surface of the insulating film ring 32 that is flush with the surface 13. As a result, there is no level difference between the surface 13 of the Si substrate 29 and the upper surface of the insulating film ring 32, and therefore the flatness of the surface 13 of the Si substrate 29 can be maintained. In the present embodiment, the insulating film ring 32 is made of silicon oxide ($SiO_2$), and is formed in an annular shape whose outer diameter $R_1$ is about 12 μm and whose inner diameter (i.e., diameter of the opening 42 of the insulating film ring 32) $R_2$ is about 8 μm.

The surface pad 33 is made of aluminum (Al), and has a multi-layer pad structure in which the surface pad 33 is stacked on the gate insulating film 30 and on the interlayer insulating film (the first interlayer insulating film 37) between the gate insulating film 30 and the uppermost interlayer insulating film (the second interlayer insulating film 38).

In the present embodiment, the surface pad 33 has a two-layer pad structure, and includes a lower pad 39 formed on the gate insulating film 30 and an upper pad 40 formed on the first interlayer insulating film 37, and an electric connection is made between the lower pad 39 and the upper pad 40 that lie on each other in the up-down direction through a plurality of electrically-conductive vias 41 that pass through the first interlayer insulating film 37. The layered structure of the surface pad 33 is not limited to the two-layer structure, and may be, for example, a three-layer structure, a four-layer structure, a five-layer structure, or a more layered structure. Additionally, the material of the surface pad 33 may be another metallic material such as copper (Cu).

The surface pad 33 is formed to face the opening 42 of the insulating film ring 32 in such a manner as to cover the opening 42 therewith on each of the insulating films 30 and 37. Each surface pad 33 is formed in a quadrangle having a width $W_1$ (e.g., $W_1$=about 10 μm) that is smaller than the outer diameter $R_1$ of the insulating film ring 32 and that is greater than the inner diameter $R_2$ thereof, and each surface pad 33 is fitted inside the outer periphery of the insulating film ring 32 in a bottom view of the Si substrate 29 seen from the side of the reverse surface 14.

A plurality of pad-to-pad wiring lines 34 are selectively laid between mutually adjoining upper pads 40 on the first interlayer insulating film 37. The pad-to-pad wiring line 34 may be laid between the lower pads 39 on the gate insulating film 30.

The through electrode 17 is made of copper (Cu), and is formed in a cylindrical shape. The through electrode 17 passes through the opening 42 of the insulating film ring 32 perpendicularly with respect to the reverse surface 14 from the reverse surface 14 of the Si substrate 29. The through electrode 17 reaches the surface pad 33 (the lower pad 39). As a result, the through electrode 17 and the surface pad 33 are arranged on the same straight line in the thickness direction of the Si substrate 29. The through electrode 17 and the surface pad 33 are not necessarily required to be arranged on the same straight line, and, for example, the surface pad 33 may be disposed apart from the through electrode 17, when viewed planarly, by drawing and turning a rewiring line etc., from an end on the surface side 13 of the Si substrate 29 of the through electrode 17.

The through electrode 17 includes a bottom portion 43 inside the opening 42 of the insulating film ring 32 and a main portion 44 outside the opening 42, and the main portion 44 evenly projects in the lateral direction (i.e., in a direction along the surface 13 of the Si substrate 29) with respect to the opening 42 so as to lie on the whole circumference of an inner edge portion 45 of the insulating film ring 32 that partitions the opening 42. As a result, the main portion 44 of the through electrode 17 has a diameter $R_3$ equal to or greater than the width $W_1$ of the surface pad 33. In the present embodiment, the diameter $R_3$ is, for example, about 10 µm ($R_3$=about 10 µm).

In the insulating film ring 32, the inner edge portion 45 lying on the main portion 44 of the through electrode 17 is formed to be thinner than an outer edge portion 46 that defines the external shape of the insulating film ring 32. For example, the thickness $T_1$ of the inner edge portion 45 of the insulating film ring 32 is about 0.2 µm, and the thickness $T_2$ of the outer edge portion 46 is about 0.4 µm.

The via insulating film 35 is made of silicon oxide ($SiO_2$), and is disposed in the whole area of the reverse surface 14 of the Si substrate 29 between the through electrode 17 and the Si substrate 29.

In the present embodiment, the via insulating film 35 includes a bottom portion 47 with which the side surface (circumferential surface) of the bottom portion 43 of the through electrode 17 is covered, a main portion 48 with which the side surface (circumferential surface) of the main portion 44 of the through electrode 17 is covered, and a reverse portion 49 with which the reverse surface 14 of the Si substrate 29 is covered. The main portion 48 of the via insulating film 35 and the reverse portion 49 of the via insulating film 35 are formed integrally with each other. On the other hand, a predetermined distance is given along the inner edge portion 45 of the insulating film ring 32 between the main portion 48 of the via insulating film 35 and the bottom portion 47 of the via insulating film 35, and these parts 47, 48 are divided from each other by means of the inner edge portion 45 of the insulating film ring 32.

In the via insulating film 35, the main portion 48 and the bottom portion 47 are formed to be thinner than the reverse portion 49. For example, the thickness of the main portion 48 and the thickness of the bottom portion 47 are about 0.5 µm, and the thickness of the reverse portion 49 is about 1 µm.

The surface bumps 36 are disposed directly above the through electrodes 17 one by one so that the surface pad 33 is placed between the through electrode 17 and the surface bump 36 on the second interlayer insulating film 38. Each surface bump 36 is electrically connected to the upper pad 40 lying thereon in the up-down direction through an electrically-conductive via 50 that passes through the second interlayer insulating film 38. Additionally, each surface bump 36 is connected to, for example, the reverse bump 20 (see FIG. 1) of the Si interposer 5 in a state in which the Si interposer 5 is stacked on the arithmetic chip 4.

As described above, the reverse bumps 19 are disposed one by one at the end on the reverse surface side 14 of each through electrode 17.

In the present embodiment, the arrangement of the arithmetic chip 4 having the insulating film ring 32 described above is employed also in the Si interposer 5 that is a semiconductor substrate (Si substrate) provided with through electrodes 18. Additionally, the through electrode 17 having the bottom portion 43 formed more thinly than the main portion 44 by forming the insulating film ring 32 has no need to be used for both the power-supply wiring line 8 and the signal-system wiring line 9 of the electronic component 1, and, preferably, it is used for a through electrode 17 that forms the signal-system wiring line 9 that is not particularly required to reduce wiring-line resistance.

FIG. 5A to FIG. 5M are views showing a part of a process for manufacturing the arithmetic chip 4 of FIG. 4 in process sequence.

Figure 5A:
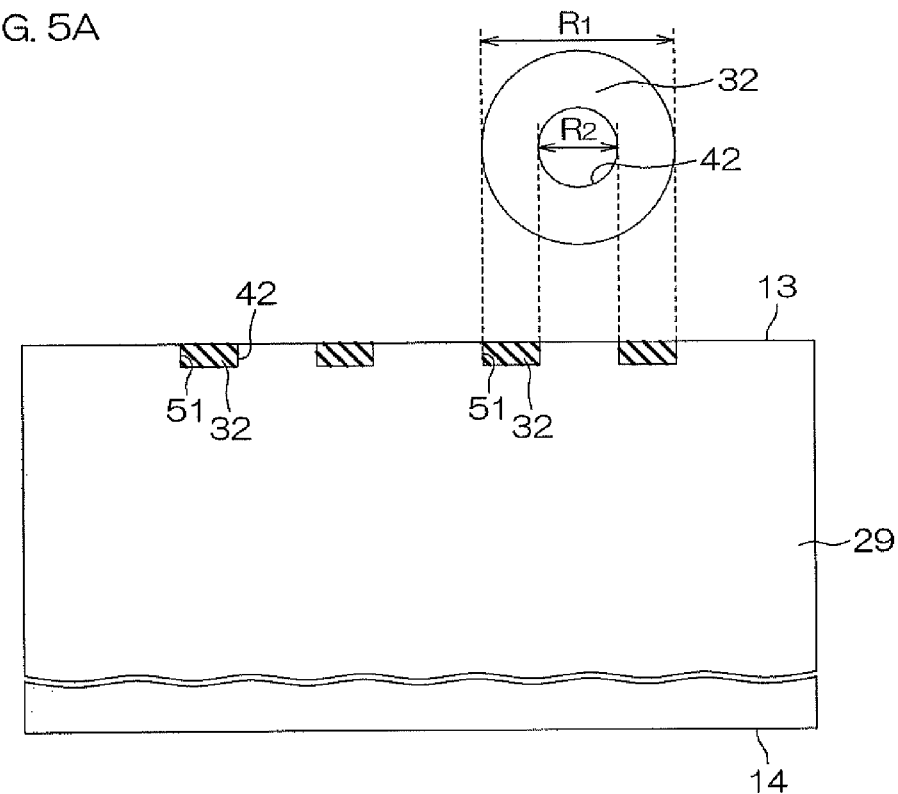
FIG. 5A is a view showing a part of a process for manufacturing the arithmetic chip of FIG. 4.

In order to manufacture the arithmetic chip 4, first, the Si substrate 29 having a thickness of 700 µm or more is etched from the surface 13 as shown in FIG. 5A, and, as a result, an annular shallow trench 51 is selectively formed, and the shallow trench 51 is filled with $SiO_2$ (insulation material) according to a CVD method. As a result, the insulating film ring 32 (outer diameter $R_1$=12 µm, inner diameter $R_2$=8 µm) embedded in the Si substrate 29 is formed. A step of forming this insulating film ring 32 can be performed at the same step as a step of forming a plurality of element isolation regions in the Si substrate 29 by, for example, an STI (Shallow Trench Isolation) process, and therefore the insulating film ring 32 can be efficiently formed.

Thereafter, ion implantation (e.g., n type ions, p type ions) is performed to the surface 13 of the Si substrate 29 according to a well-known method, not shown, and, as a result, impurity regions that serve as constituents of a semiconductor element are formed.

Figure 5B:
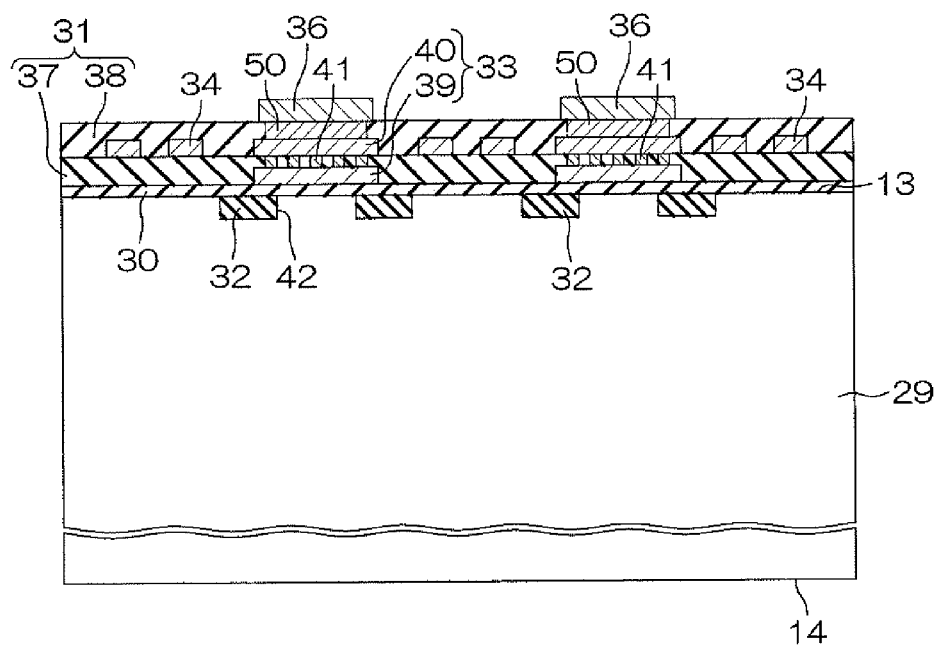
FIG. 5B is a view showing a step subsequent to the step of FIG. 5A.

Thereafter, as shown in FIG. 5B, the gate insulating film is formed according to a thermal oxidation method. Thereafter, the lower pad 39, the first interlayer insulating film 37, the via 41, the upper pad 40 and the pad-to-pad wiring line 34, the second interlayer insulating film 38, the via 50, and the surface bump 36 are formed on the gate insulating film 30 in this order according to a well-known semiconductor-device manufacturing technique such as spattering, photolithography, or CVD.

Figure 5C:
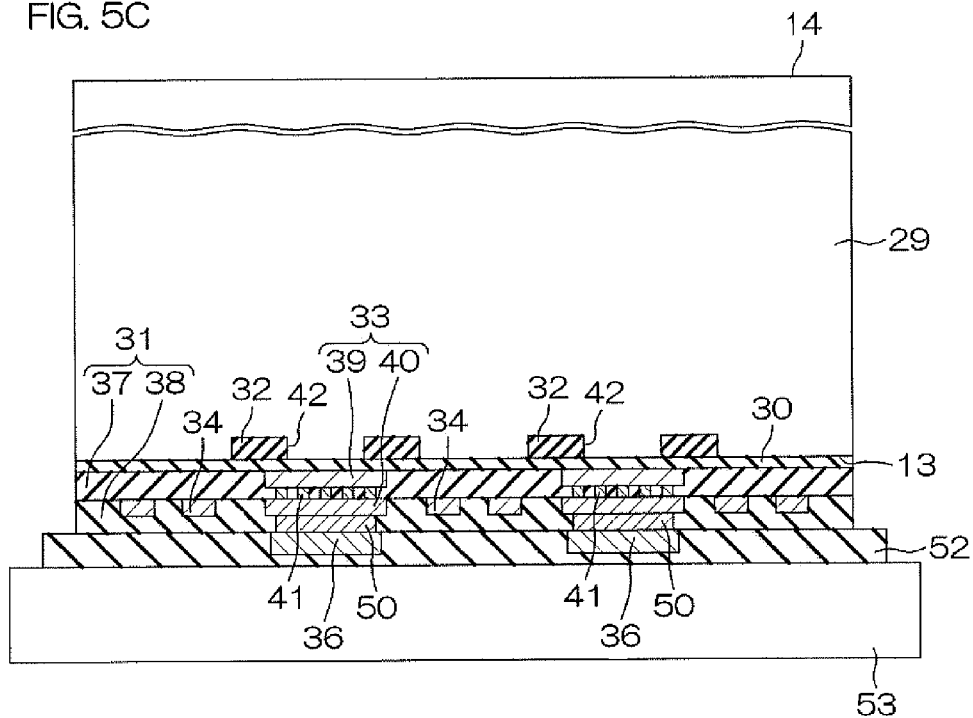
FIG. 5C is a view showing a step subsequent to the step of FIG. 5B.

Thereafter, as shown in FIG. 5C, a glass substrate (a supporting element) 53 is bonded to the surface side 13 of the Si substrate 29 with an adhesive 52.

Figure 5D:
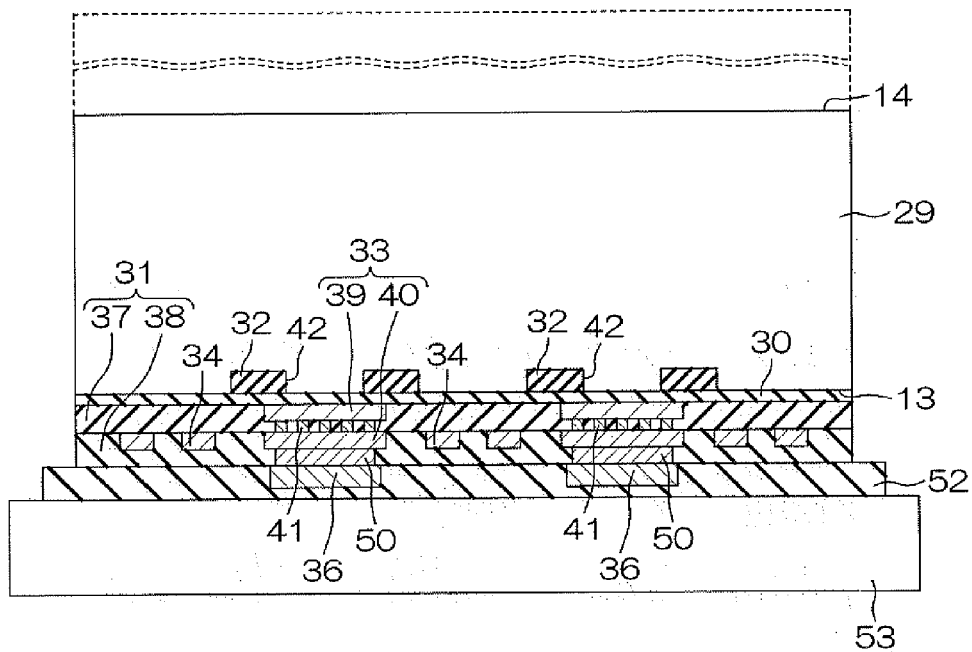
FIG. 5D is a view showing a step subsequent to the step of FIG. 5C.

Thereafter, as shown in FIG. 5D, the Si substrate 29 is ground from the reverse surface side 14 (back grinding) by use of, for example, a grinder, and the Si substrate 29 is thinned. In the present embodiment, grinding is performed until the Si substrate 29 having a thickness of 700 µm or more is thinned to be 30 µm to 50 µm.

Figure 5E:
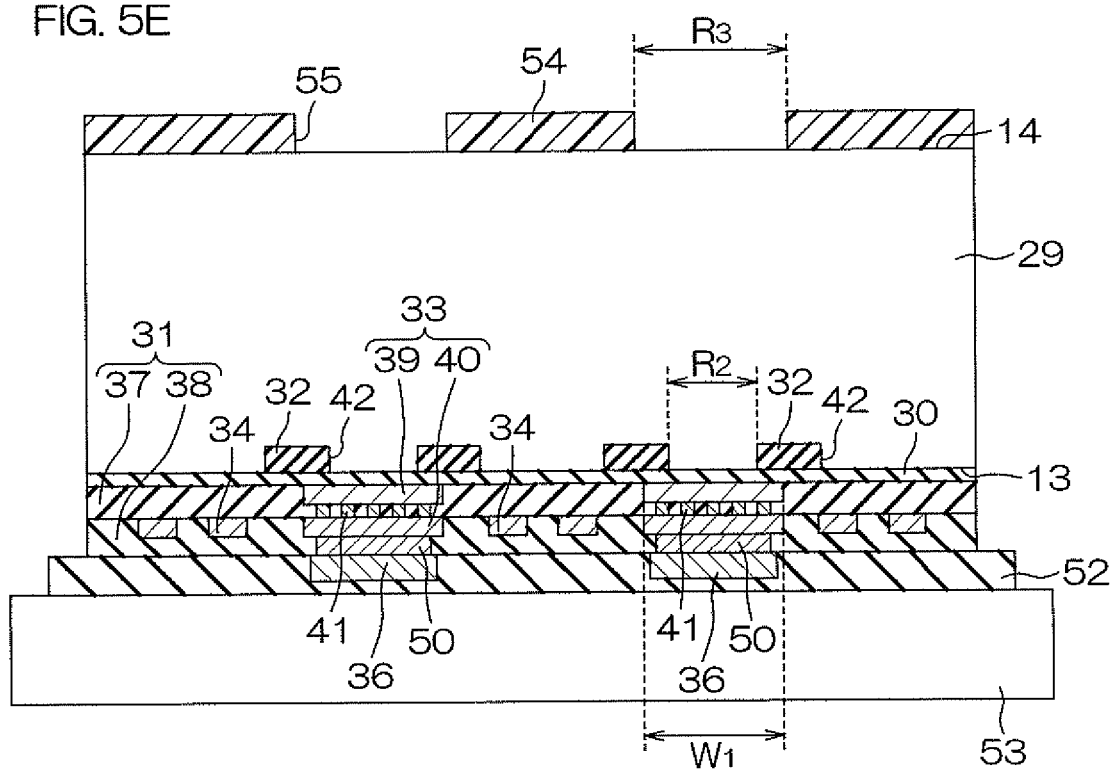
FIG. 5E is a view showing a step subsequent to the step of FIG. 5D.

Thereafter, as shown in FIG. 5E, position adjustment is performed based on the opening 42 of the insulating film ring 32, and a photoresist 54 provided with an opening 55 (e.g., organic resist such as polyimide) having the same diameter $R_3$ ($R_3 \geq$ width $W_1$ of the surface pad 33, inner diameter $R_2$ of the insulating film ring 32) as the main portion 44 in a region, in which the through electrode 17 is to be formed, is formed on the reverse surface 14 of the Si substrate 29.

Figure 5F:
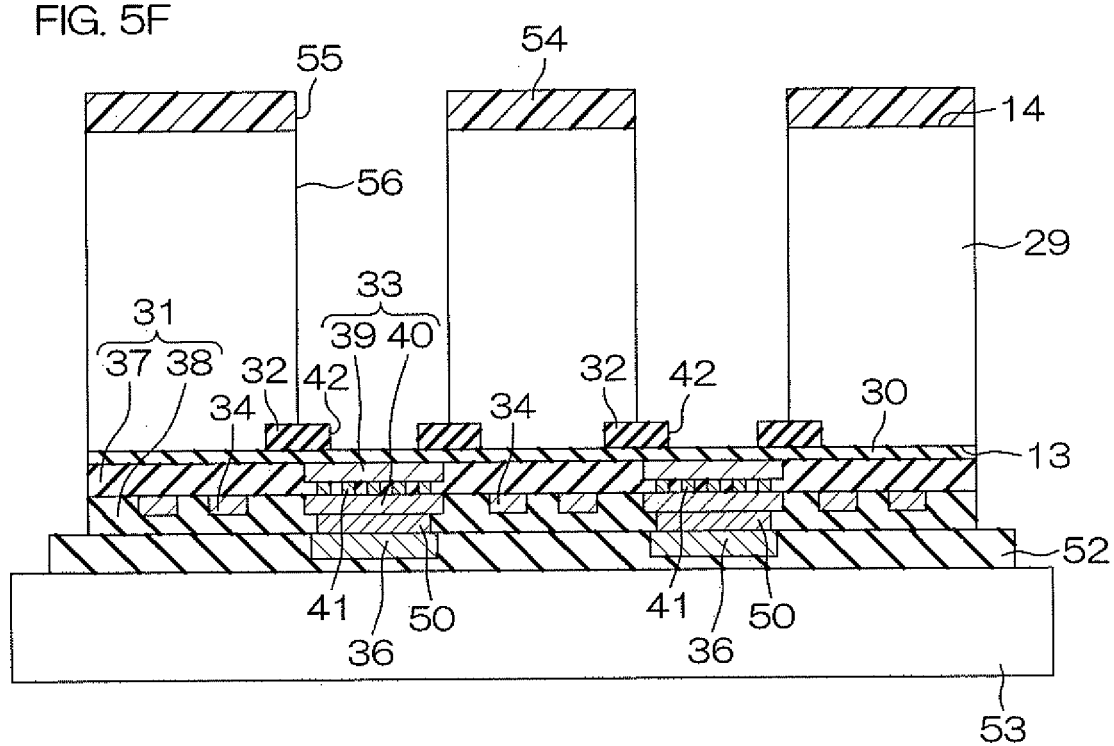
FIG. 5F is a view showing a step subsequent to the step of FIG. 5E.

Thereafter, as shown in FIG. 5F, etching gas (e.g., $SF_6/O_2$) is supplied to the Si substrate 29 through the photoresist 54, and the Si substrate 29 is subjected to dry etching from the reverse surface side 14. After reaching the insulating film ring 32, this etching is guided to the opening 42 of the insulating film ring 32 by use of a difference in the etching rate between the insulating film ring ($SiO_2$) 32 and the Si substrate 29 (using the insulating film ring 32 as a mask). Thereafter, etching is continuously performed with the same gas type without changing the etching gas type until the gate insulating film 30 is exposed after passing through the opening 42 of the insulating film ring 32. As a result, a through hole 56 is formed in the Si substrate 29, and the inner edge portion 45 of the insulating film ring 32 is exposed in each through hole 56.

Thereafter, as shown in FIG. 5G, the gate insulating film 30 forming the bottom surface of the through hole 56 is etched in a state in which the photoresist 54 appearing during the formation of the through hole 56 is remaining, and, as a result, the surface pad 33 (lower pad 39) is exposed in the through hole 56. At this time, the inner edge portion 45, which is inside the side surface of the through hole 56 in the insulating film ring 32 made of the same material ($SiO_2$) as the gate insulating film 30, is also exposed to the etching gas, and hence is etched simultaneously with the gate insulating film 30. As a result, a level difference (difference in thickness) is generated between the inner edge portion 45 and the outer edge portion 46 of the insulating film ring 32.

Thereafter, as shown in FIG. 5H, the photoresist 54 is removed, and then the via insulating film 35 is formed on the inner surface of the through hole 56 and on the reverse surface 14 of the Si substrate 29 so that the surface pad 33 exposed in the through hole 56 is covered therewith according to the CVD method.

Figure 5I:
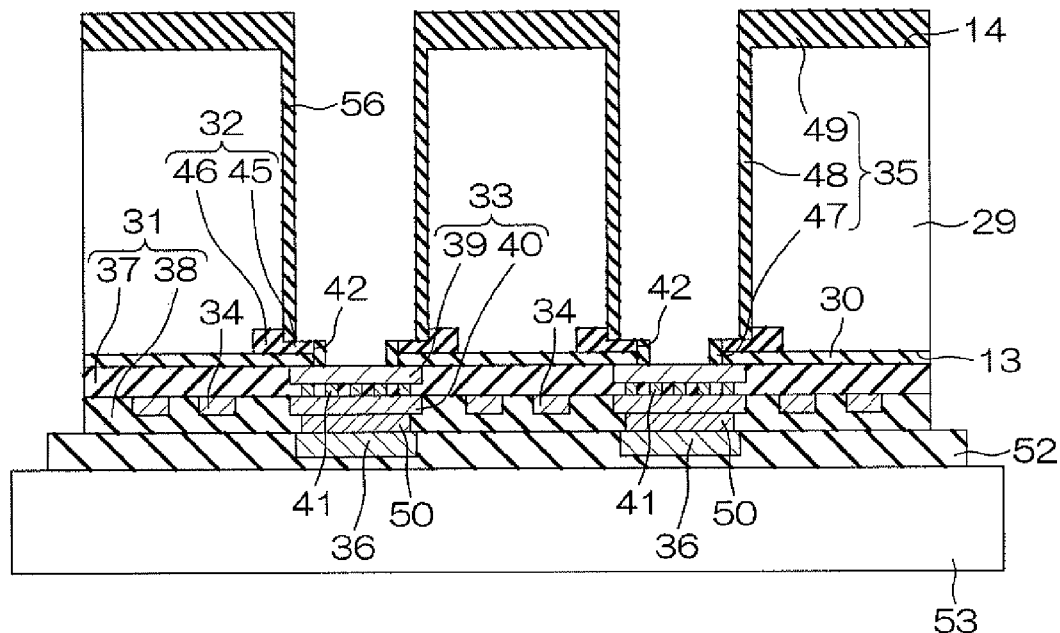
FIG. 5I is a view showing a step subsequent to the step of FIG. 5H.

Thereafter, as shown in FIG. 5I, a part facing an opening end of the through hole 56 in the via insulating film 35, i.e., more specifically, a part (bottom surface part) on the surface pad 33 and a part on the inner edge portion 45 of the insulating film ring 32 are selectively removed by etchback. As a result, the surface pad 33 (lower pad 39) is again exposed in the through hole 56.

Figure 5J:
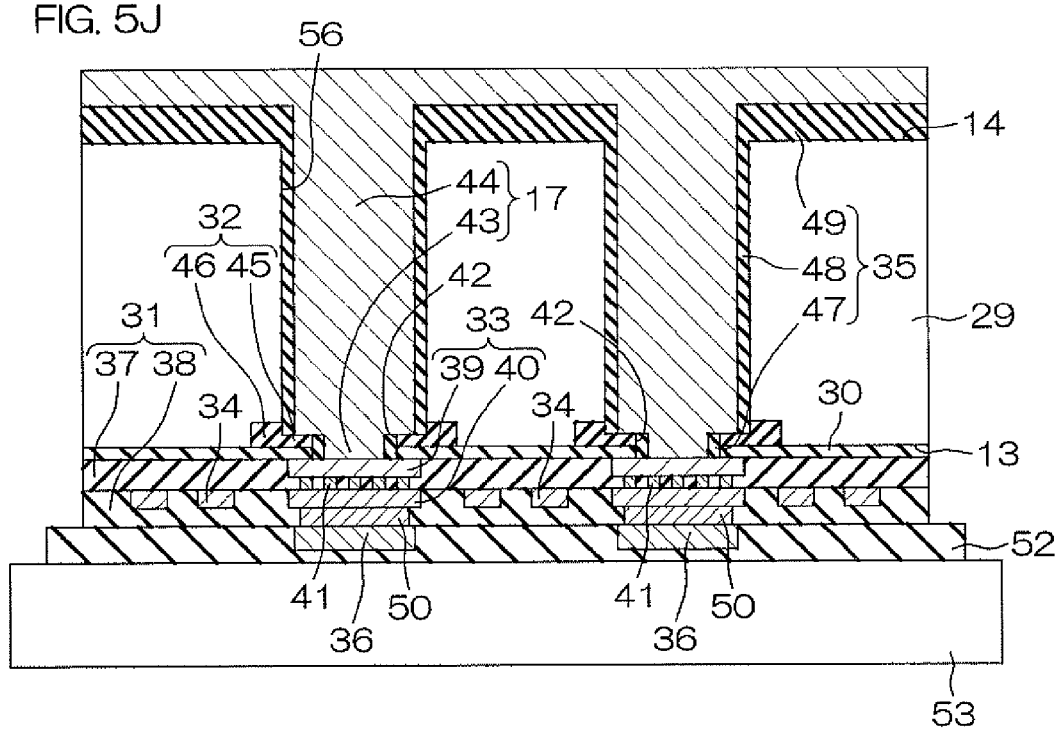
FIG. 5J is a view showing a step subsequent to the step of FIG. 5I.

Thereafter, as shown in FIG. 5J, a seed film (e.g., Ti/Cu laminated film) is spattered on the surface of the via insulating film 35, and then the plating growth of Cu is produced from this seed film according to electrolytic plating. As a result, the inside of the via insulating film 35 in the through hole 56 is filled with Cu (electrode material), and the through electrode 17 electrically connected to the surface pad 33 is formed.

Figure 5K:
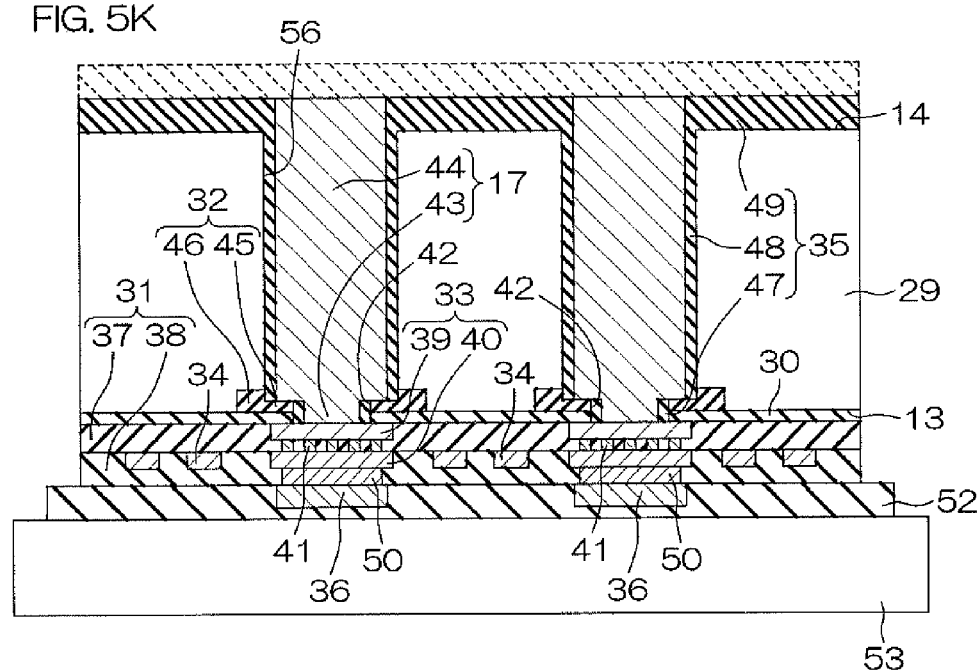
FIG. 5K is a view showing a step subsequent to the step of FIG. 5J.

Thereafter, as shown in FIG. 5K, an extra part of the through electrode 17 (i.e., a part outside the through hole 56) is ground and removed according to a CMP (Chemical Mechanical Polishing) method until the ground surface becomes flush with the reverse portion 49 of the via insulating film 35.

Figure 5L:
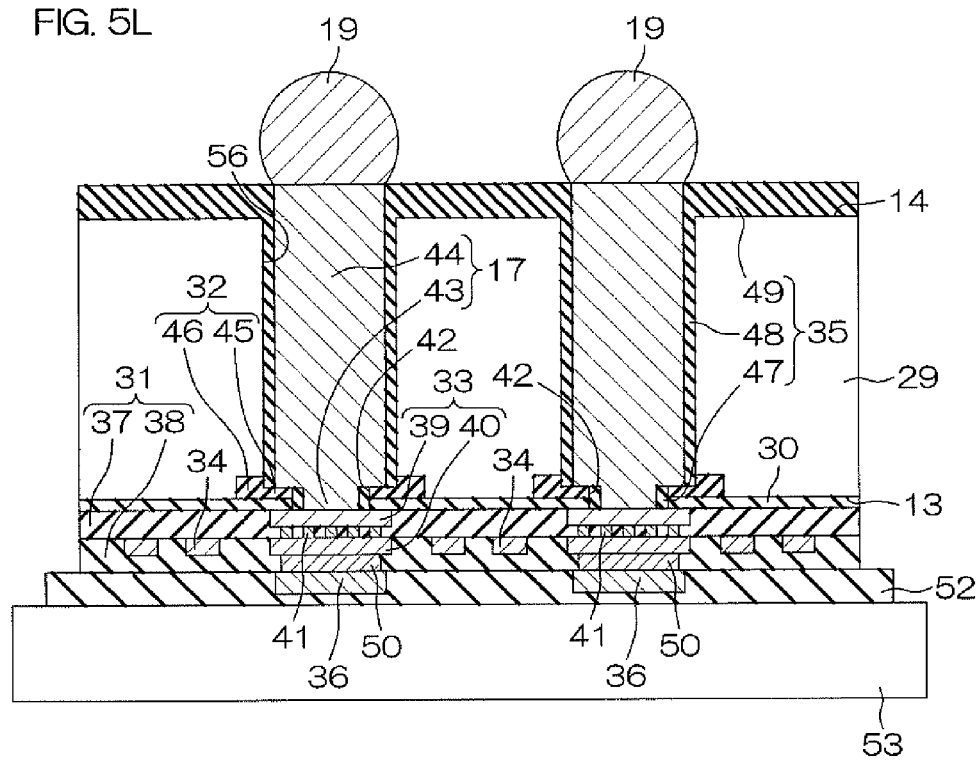
FIG. 5L is a view showing a step subsequent to the step of FIG. 5K.
Figure 5M:
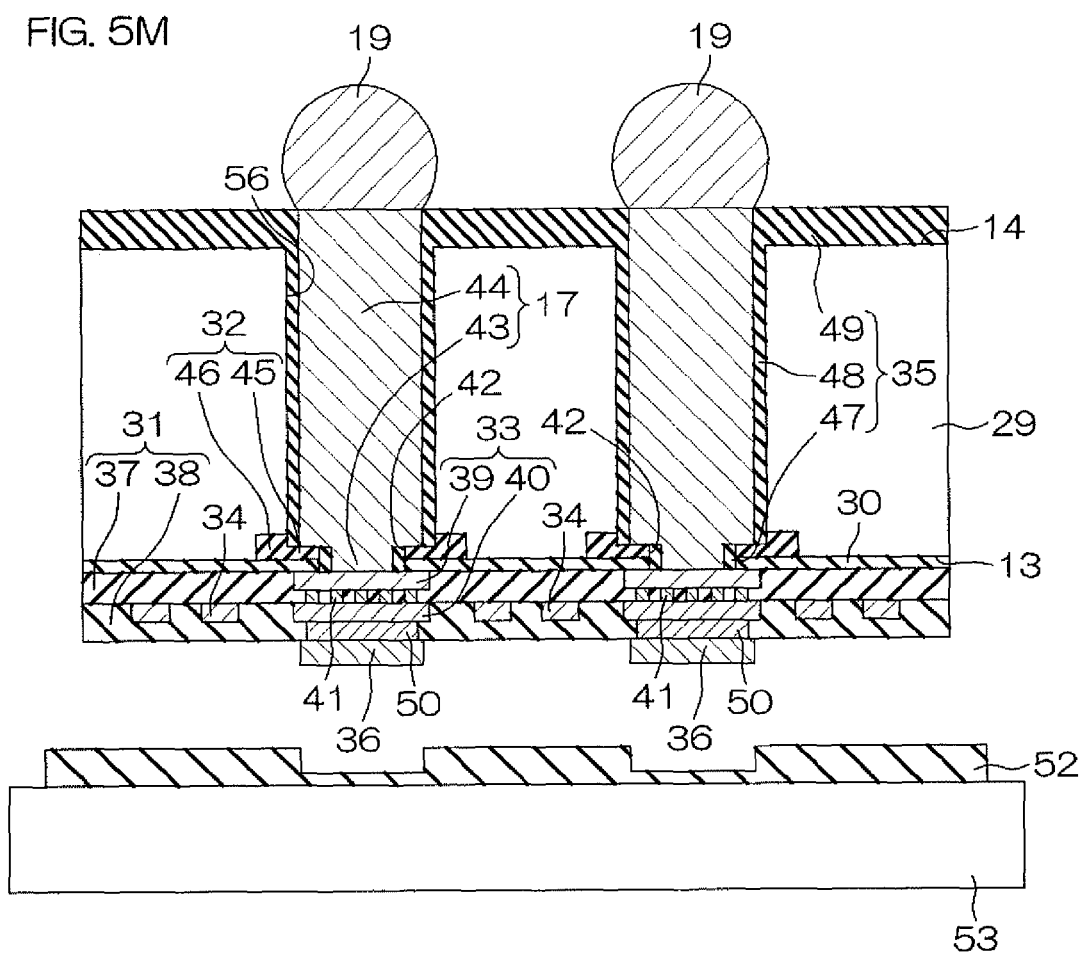
FIG. 5M is a view showing a step subsequent to the step of FIG. 5L.

Thereafter, as shown in FIG. 5L, the reverse bump 19 is formed on each through electrode 17 one by one, and, as shown in FIG. 5M, the Si substrate 29 is detached from the glass substrate 53, and, as a result, the arithmetic chip 4 of FIG. 4 can be obtained.

According to the method of the present embodiment described above, the insulating film ring 32 that has the opening 42 facing the position of the surface pad 33 is beforehand formed as shown in FIG. 5A. Therefore, at the step of FIG. 5F in which the Si substrate 29 is etched from the reverse surface 14 toward the surface pad 33 after forming the surface pad 33 on the insulating film ring 32, dry etching can be guided to the opening 42 by use of a difference in the etching rate between the insulating film ring ($SiO_2$) 32 and the Si substrate 29 (by using the insulating film ring 32 as a mask) after the dry etching reaches the insulating film ring 32 even if a gap is generated between an ideal etching position (position of the opening 42 of the insulating film ring 32) and an actual etching position.

Therefore, the bottom portion of the through hole 56 formed by this etching can be fixed to the position of the opening 42 of the insulating film ring 32, and can be made thinner than the width $W_1$ of the surface pad 33. In other words, the through hole 56 can be allowed to reach the surface pad 33 disposed so as to face the opening 42 of the insulating film ring 32 in a self-aligned manner. As a result, the through electrode 17 can be reliably brought into contact with the surface pad 33 by allowing the through hole 56 to undergo the plating growth of Cu.

Therefore, according to the present embodiment, the through hole 56 that reaches the surface pad 33 can be accurately formed regardless of the size (width $W_1$) of the surface pad 33 unlike a conventional example in which the surface pad 33 has been always designed to be greater than the diameter $R_3$ of the through hole 56 in consideration of the matching accuracy of patterning performed when the through hole 56 is formed. Therefore, the degree of freedom of the size of the surface pad 33 can be widened.

This makes it possible to make the surface pad 33 smaller in size than a conventional one when the through electrode 17 is greatly reduced in size in the arithmetic chip 4. As a result, the through electrodes 17 can be disposed in a high density, and therefore it is possible to achieve a semiconductor chip that is small in size, that is large in capacity, and that is high in performance.

Additionally, a space between mutually adjoining surface pads 33 can be widened by reducing the surface pad 33 in size, and therefore the pad-to-pad wiring line 34 can be laid while effectively using the space.

In the method of the present embodiment, although the insulating film ring 32 that fixes the bottom portion 43 of the through electrode 17 is required to be positionally adjusted with respect to the surface pad 33 with accuracy, the distance between the insulating film ring 32 and the surface pad 33 is only the thickness of the gate insulating film 30 at the most, and therefore an accurate positional adjustment can also be performed according to a well-known method.

Additionally, according to the arithmetic chip 4, even when a force is applied to the end on the reverse surface side 14 of the through electrode 17 (main portion 44) through the reverse bump 19, the insulating film ring 32 (inner edge portion 45) lying on the main portion 44 acts as a buffering material, and therefore a force transmitted to the surface pad 33 can be reduced. As a result, the surface pad 33 can be prevented from being damaged, for example, when the arithmetic chip 4 is mounted on the resin interposer 2.

Additionally, according to the arithmetic chip 4, the end on the surface side 13 of the through electrode 17 (main portion 44) has been moved back toward the reverse surface 14 by the thickness $T_1$ of the inner edge portion 45 of the insulating film ring 32, and therefore it is possible to make the aspect ratio of the through electrode 17 (height of the through electrode 17/diameter $R_3$ of the through electrode 17) smaller. Therefore, the step coverage fulfilled when the through hole 56 is filled with an electrode material can be improved.

Additionally, according to the arithmetic chip 4, a leakage current can be prevented from flowing between the through electrode 17 and the Si substrate 29.

In other words, the via insulating film 35 (the main portion 48 and the bottom portion 47) on the inner surface of the through hole 56 is not so thick although the bottom surface part of the via insulating film 35 is removed by etchback so as to expose the surface pad 33 at the step of FIG. 5I. Therefore, there is a fear that the via insulating film 35 formed on the side surface of the bottom portion of the through hole 56 will be also removed along therewith when etchback is performed.

Therefore, in the present embodiment, even when the via insulating film 35 on the side surface of the bottom portion of the through hole 56 is removed, the insulating film ring 32 remains therearound, and therefore an insulation state between the through electrode 17 and the Si substrate 29 can be maintained. As a result, a leakage current can be prevented from flowing between the through electrode 17 and the Si substrate 29.

Additionally, according to the electronic component 1 of FIG. 1, the arithmetic chip 4 and the Si interposer 5 mentioned above are mounted thereon, and therefore a reduction in size, an increase in capacity, and an improvement in performance can be achieved by providing the through electrodes 17 at the arithmetic chip 4 and the Si interposer 5 in a high density.

Although the preferred embodiment of the present invention has been described as above, the present invention can be embodied in other modes.

For example, the through electrode 17 may be formed in an elliptic cylinder shape, a quadrangular prism shape, a hexagonal prism shape, or an octagonal prism shape, and the insulating film ring 32 may also be formed in an elliptic annular shape, a quadrangular annular shape, a hexagonal annular shape, or an octagonal annular shape.

Additionally, at the step of FIG. 5J, the through electrode 17 can be formed by filling the through hole 56 with polysilicon according to the CVD method. However, in that case, the Si substrate 29 and the glass substrate 53 are exposed to a high temperature, and therefore there is a need to adopt measures so that the adhesive 52 is not melted. In other words, when the heat-resistant temperature of the adhesive 52 is comparatively low (about 200° C.), it is preferable to employ the electrolytic plating method as in the aforementioned preferred embodiment.

Additionally, although the step of forming the insulating film ring 32 is performed at the same step as the STI step of forming element isolation regions in the Si substrate 29 at the step of FIG. 5A, those may be performed independently of each other. Additionally, the step of forming the insulating film ring 32 may include a step of forming an insulating film on the surface 13 of the Si substrate 29 by means of thermal oxidation and a step of forming the insulating film ring 32 so as to protrude with respect to the surface 13 of the Si substrate 29 by subjecting the insulating film to patterning.

With regard to other respects, various design changes can be made within the scope of the appended claims.

REFERENCE SIGNS LIST

1 Electronic component
2 Resin interposer
3 Surface (of resin interposer)
4 Arithmetic chip
5 Si interposer
6 Memory chip
7 Resin package
8 Power-supply wiring line
9 Signal-system wiring line
10 Reverse surface (of resin interposer)
11 Outside terminal
12 Logic control circuit
13 Surface (of arithmetic chip)
14 Reverse surface (of arithmetic chip)
15 Surface (of Si interposer)
16 Reverse surface (of Si interposer)
17 Through electrode (of arithmetic chip)
18 Through electrode (of Si interposer)
19 Reverse bump (of arithmetic chip)
20 Reverse bump (of Si interposer)
21 Memory cell array
22 Control circuit
23 Reverse surface (of memory chip)
24 Reverse bump (of memory chip)
25 Central part (of arithmetic chip)
26 Peripheral edge (of arithmetic chip)
27 Central part (of Si interposer)
28 Peripheral edge (of Si interposer)
29 Si substrate
30 Gate insulating film
31 Interlayer insulating film
32 Insulating film ring
33 Surface pad
34 Pad-to-pad wiring line
35 Via insulating film
36 Surface bump
37 First interlayer insulating film
38 Second interlayer insulating film
39 Lower pad
40 Upper pad
41 Via
42 Opening (of insulating film ring)
43 Bottom portion (of through electrode)
44 Main portion (of through electrode)
45 Inner edge portion (of insulating film ring)
46 Outer edge portion (of insulating film ring)
47 Bottom portion (of via insulating film)
48 Main portion (of via insulating film)
49 Reverse portion (of via insulating film)
50 Via
51 Shallow trench
52 Adhesive
53 Glass substrate
54 Photoresist
55 Opening (of photoresist)
56 Through hole

The invention claimed is:

1. A semiconductor device comprising:
a semiconductor substrate;
an insulating film ring selectively formed in a surface portion of the semiconductor substrate, the insulating film ring having a ring opening;
an insulating film formed on the semiconductor substrate, the insulating film having a film opening that is a same size of the ring opening and that is formed directly over the ring opening, the insulating film ring including a concave portion around the ring opening;
a through electrode penetrating through the semiconductor substrate, the through electrode passing through the ring opening and the film opening at least to reach a surface of the semiconductor substrate, the through electrode having a bottom portion inside the ring opening and the film opening, and a main portion outside the ring opening and the film opening, the concave portion of the insulating film supporting the main portion of the through electrode;
a via insulating film disposed between the through electrode and the semiconductor substrate; and
a surface electrode formed on the insulating film, the surface electrode facing the film opening, and being electrically connected to the through electrode.

2. The semiconductor device according to claim 1, wherein the main portion projects in a lateral direction with respect to the ring opening so as to lie on an inner edge portion of the insulating film ring that defines the ring opening.

3. The semiconductor device according to claim 2, wherein the inner edge portion of the insulating film ring is formed to be thinner than an outer edge portion that defines an external shape of the insulating film ring.

4. The semiconductor device according to claim 2, wherein the insulating film ring is embedded in the surface portion of the semiconductor substrate.

5. The semiconductor device according to claim 2, further comprising:
a plurality of surface electrodes, and
a wiring connecting adjacent surface electrodes of the plurality of surface electrodes.

6. The semiconductor device according to claim 1, wherein the main portion of the through electrode has a diameter equal to or greater than a diameter of the surface electrode.

7. The semiconductor device according to claim 6, wherein the inner edge portion of the insulating film ring is formed to be thinner than an outer edge portion that defines an external shape of the insulating film ring.

8. The semiconductor device according to claim 1, wherein the insulating film ring is embedded in the surface portion of the semiconductor substrate.

9. The semiconductor device according to claim 1, further comprising:
a plurality of surface electrodes; and
a wiring connecting adjacent surface electrodes of the plurality of surface electrodes.

10. The semiconductor device according to claim 1, wherein the surface electrode includes a multi-layer electrode whose layers are stacked with an interlayer insulating film therebetween.

11. The semiconductor device according to claim 1, further comprising a surface bump for external connection, the surface bump being disposed directly above the through electrode with the surface electrode therebetween.

12. The semiconductor device according to claim 1, further comprising a reverse bump for external connection,
wherein the surface of the semiconductor substrate is a front surface, the semiconductor substrate has a reverse surface that is opposite to the front surface, and the reverse bump is disposed on the reverse surface and is electrically contacted to the through electrode.

13. The semiconductor device according to claim 1, wherein the insulating film ring is formed in an annular shape.

14. The semiconductor device according to claim 1, wherein the through electrode is formed in a cylindrical shape.

15. The semiconductor device according to claim 1, further comprising a semiconductor element formed in the surface portion of the semiconductor substrate.

16. An electronic component comprising:
an interposer having a plurality of outside terminals at a reverse surface thereof;
the semiconductor device according to claim 1 stacked on a surface of the interposer in a posture in which a surface of the semiconductor device is directed upwardly;
a second semiconductor device having a plurality of reverse bumps, the second semiconductor device stacked on the surface of the semiconductor device so that the reverse bump is electrically connected to the through electrode; and
a resin package sealing the semiconductor device and the second semiconductor device.

17. The semiconductor device according to claim 1, wherein
the insulating film ring includes an outer edge portion encompassing the through electrode, and an inner edge portion sandwiched between the main portion of the through electrode and the surface electrode.

18. The semiconductor device according to claim 1, wherein
a first portion of the via insulating film is formed on a side surface of the ring opening and the film opening, and
a second portion of the via insulating film is formed on a side surface of the through hole and is disconnected from the first portion.

19. The semiconductor device according to claim 1, wherein
the ring opening has different opening sizes between an upper side facing the insulating film and a bottom side facing the semiconductor substrate, a size of the upper side of the ring opening being smaller than a size of the bottom side of the ring opening.

20. A method for manufacturing a semiconductor device, the method comprising:
a step of selectively forming, in a front surface portion of a semiconductor substrate, an insulating film ring having a ring opening;
a step of forming an insulating film on the insulating film ring and a front surface of the semiconductor substrate;
a step of forming a surface electrode so as to face the ring opening on an opposite side of the semiconductor substrate with respect to the insulating film ring;
a step of forming a through hole that passes through the ring opening and a film opening that pass through the insulating film, and then reaches the surface electrode by etching the semiconductor substrate from a side of a reverse surface to a side of the front surface of the semiconductor substrate, the reverse surface being opposite to the front surface of the semiconductor substrate, the film opening being a same size of the ring opening and being formed directly over the ring opening;
a step of forming a via insulating film on a side surface of the through hole; and
a step of forming a through electrode so as at least to reach the front surface of the semiconductor substrate and to be electrically connected to the surface electrode by filling the through hole having the via insulating film with an electrode material, wherein
the step of forming a through hole includes forming a concave portion around the ring opening, and
the step of forming a through electrode includes forming the through electrode to have a bottom portion inside the ring opening and the film opening, and a main portion supported by the concave portion outside the ring opening and the film opening.

21. The method for manufacturing a semiconductor device according to claim 20, wherein the step of forming the through hole includes a step of etching the semiconductor substrate by use of a pattern diameter greater than a diameter of the ring opening so that an inner edge portion in the insulating film ring for defining the ring opening is exposed in the through hole.

22. The method for manufacturing a semiconductor device according to claim 20, wherein the step of forming the through hole includes a step of etching the semiconductor substrate by use of a pattern diameter equal to or greater than a diameter of the surface electrode.

23. The method for manufacturing a semiconductor device according to claim 20, wherein the step of forming the insulating film ring includes
 a step of forming a shallow trench by etching the semiconductor substrate from the side of the front surface of the semiconductor substrate and
 a step of embedding the insulating film ring in the front surface portion of the semiconductor substrate by filling the shallow trench with an insulation material.

24. A semiconductor device comprising:
 a semiconductor substrate;
 an insulating film ring selectively formed in a surface portion of the semiconductor substrate, the insulating film ring having a ring opening;
 an insulating film formed on the semiconductor substrate, the insulating film having a film opening that is a same size of the ring opening and that is formed directly over the ring opening;
 a through electrode penetrating through the semiconductor substrate, the through electrode passing through the ring opening and the film opening at least to reach a surface of the semiconductor substrate;
 a via insulating film disposed between the through electrode and the semiconductor substrate; and
 a surface electrode formed on the insulating film, the surface electrode facing the film opening, and being electrically connected to the through electrode, wherein
 the through electrode includes a bottom portion inside the ring opening and the film opening, and a main portion outside the ring opening and the film opening, and
 the insulating film ring includes an outer edge portion encompassing the through electrode, and an inner edge portion sandwiched between the main portion of the through electrode and the surface electrode.

25. A semiconductor device comprising:
 a semiconductor substrate;
 an insulating film ring selectively formed in a surface portion of the semiconductor substrate, the insulating film ring having a ring opening;
 an insulating film formed on the semiconductor substrate, the insulating film having a film opening that is a same size of the ring opening and that is formed directly over the ring opening;
 a through electrode penetrating through the semiconductor substrate, the through electrode passing through the ring opening and the film opening at least to reach a surface of the semiconductor substrate;
 a via insulating film disposed between the through electrode and the semiconductor substrate; and
 a surface electrode formed on the insulating film, the surface electrode facing the film opening, and being electrically connected to the through electrode, wherein
 the through electrode includes a bottom portion inside the ring opening and the film opening and the insulating film ring, and a main portion inside a through hole of the semiconductor substrate,
 a first portion of the via insulating film is formed on a side surface of the ring opening and the film opening, and
 a second portion of the via insulating film is formed on a side surface of the through hole and is disconnected from the first portion.

* * * * *